(12) United States Patent
Jang

(10) Patent No.: US 7,315,483 B2
(45) Date of Patent: Jan. 1, 2008

(54) CIRCUIT FOR SELECTING A POWER SUPPLY VOLTAGE AND SEMICONDUCTOR DEVICE HAVING THE SAME

(75) Inventor: Tae-Seong Jang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/500,346

(22) Filed: Aug. 8, 2006

(65) Prior Publication Data

US 2007/0036019 A1  Feb. 15, 2007

(30) Foreign Application Priority Data

Aug. 12, 2005  (KR) .................. 10-2005-0074342

(51) Int. Cl.
*G11C 5/14*  (2006.01)
(52) U.S. Cl. ..................... 365/226; 365/201
(58) Field of Classification Search ........... 365/189.02
See application file for complete search history.

(56) References Cited

U.S. PATENT DOCUMENTS

| 6,845,048 | B2* | 1/2005 | Alexander et al. | 365/189.02 |
| 6,999,356 | B2* | 2/2006 | Kozuka et al. | 365/189.09 |
| 7,138,817 | B2* | 11/2006 | Suzuki et al. | 324/763 |
| 2007/0085559 | A1* | 4/2007 | Kim et al. | 324/768 |

FOREIGN PATENT DOCUMENTS

| KR | 10-2001-0004200 | 1/2001 |
| KR | 1020010105442 A | 11/2001 |
| KR | 1020020006303 A | 1/2002 |
| KR | 10-2004-0110317 | 12/2004 |
| KR | 1020050000010 A | 1/2005 |

OTHER PUBLICATIONS

Office Action in corresponding Korean Application No. 2005-74342 dated Nov. 18, 2006.

* cited by examiner

*Primary Examiner*—Tan T. Nguyen
(74) *Attorney, Agent, or Firm*—Harness, Dickey & Pierce

(57) ABSTRACT

A semiconductor memory device capable of reducing the number of pads is provided. The semiconductor memory device may include a pad, a power supply voltage generating circuit and a voltage selection circuit. The power supply voltage generating circuit may generate one or more power supply voltages, which may be used in a semiconductor device. The voltage selection circuit may select one of the power supply voltages in response to test mode signals to provide the selected power supply voltage to the pad. The voltage selection circuit may include a voltage level regulating circuit to convert voltage levels of the test mode signals to generate gate control signals and metal-oxide semiconductor (MOS) transistors connected to the power supply voltages, respectively. The MOS transistors may be selectively turned on in response to the gate control signals to provide the selected power supply voltage to the pad.

16 Claims, 4 Drawing Sheets

CIRCUIT FOR SELECTING A POWER SUPPLY VOLTAGE AND SEMICONDUCTOR DEVICE HAVING THE SAME

PRIORITY STATEMENT

This application claims priority under 35 U.S.C. § 119 to Korean Patent Application No. 2005-74342 filed on Aug. 12, 2005, the disclosure of which is incorporated herein by reference in its entirety.

BACKGROUND OF THE INVENTION

1. Field of the Invention

Example embodiments of the present invention relate to a semiconductor device, and more particularly, to a circuit for selecting a power supply voltage that may be easily tested and a semiconductor device having the same.

2. Description of the Related Art

A conventional semiconductor memory device may require one or more power supply voltages, for example, an internal power supply voltage for a peripheral circuit, an internal power supply voltage for a memory array, a plate voltage applied to a plate of a memory cell, a precharge voltage for precharging a bit line sense amplifier, and a back bias voltage for a semiconductor substrate back bias.

To test these power supply voltages, conventionally, a pad may be provided within a semiconductor chip for each of the power supply voltages. The pads in the semiconductor chip may perform a function of connecting an internal part of a semiconductor chip to an external device. The pad of the semiconductor chip may be coupled to a lead frame of a package and/or a printed circuit board (PCB) by a coupling method. For example, a wire bonding may be performed during a packaging process for the semiconductor chip. As a result, the pad may be electrically connected to a pin and/or ball of the package.

As high-density integration technology of semiconductor devices is developed, more devices may be mounted on a small-size chip. However, as semiconductor devices require higher degrees of integration, higher performance and a greater number of test items, the number of pads mounted in a chip may also increase.

Further, an area, which may be occupied by the increased number pads in the semiconductor chip, may be difficult to reduce because there are generally limits as to how much the pad size may be reduced.

SUMMARY

Example embodiments of the present invention are provided to substantially reduce and/or obviate one or more problems stemming from limitations and disadvantages of the related art as described above.

Example embodiments of the present invention provide a semiconductor memory device capable of reducing the number of pads used for testing power supply voltages of a semiconductor memory device.

Example embodiments of the present invention provide a voltage selection circuit of a semiconductor memory device, which may select one of the power supply voltages to be tested and may provide the selected voltage signal to a pad, which may reduce the number of pads of the semiconductor memory device.

An example embodiment of the present invention provides a semiconductor memory device. The semiconductor memory device may include a pad, a power supply voltage generating circuit and a voltage selection circuit. The power supply voltage generating circuit may generate one or more power supply voltages used in a semiconductor device. The voltage selection circuit may select one of the power supply voltages in response to test mode signals to provide the selected power supply voltage to the pad. The power supply voltages may include an internal power supply voltage for a peripheral circuit, an internal power supply voltage for a memory array, a plate voltage, a precharge voltage, and a back bias voltage, for example.

An example embodiment of the present invention provides a voltage selection circuit. The voltage selection circuit may include a voltage level regulating circuit and metal-oxide semiconductor (MOS) transistors. The voltage level regulating circuit may convert voltage levels of the test mode signals to generate gate control signals. The MOS transistors may be connected to the power supply voltages, respectively, and may selectively turn on in response to gate control signals to provide a selected power supply voltage to a pad.

According to an example embodiment of the present invention, the voltage level regulating circuit may include level-shifters that are coupled to gate electrodes of the MOS transistors, respectively, and generate the gate control signals in response to the test mode signals.

According to an example embodiment of the present invention, each level-shifter may include a first level-shifting circuit, an inverting circuit and a second level-shifting circuit. The first level-shifting circuit may be configured to convert a corresponding test mode signal having a first voltage level of logic high into a first output signal having a second voltage level of logic high. The second voltage level may be higher than the first voltage level. The inverting circuit may be configured to invert the first output signals. The second level-shifting circuit may be configured to convert an output signal of the inverting circuit having a third voltage level of logic low into the corresponding gate control signal having a fourth voltage level of logic low. The fourth voltage level may be lower than the third voltage level.

According to an example embodiment of the present invention, the first voltage level may be generated by an internal power supply voltage for a peripheral circuit of the semiconductor memory device, and the second voltage level may be generated by an external power supply voltage of the semiconductor memory device. In addition, the third voltage level may be generated based on a ground voltage of the semiconductor memory device, and the fourth voltage level may be generated based on a back bias voltage of the semiconductor memory device.

According to an example embodiment of the present invention, each of the level-shifters may include a level-shifting circuit configured to convert the corresponding test mode signal having a first low voltage level into the corresponding gate control signal having a second low voltage level. The second low voltage level may be lower than the first low voltage level.

According to an example embodiment of the present invention, a voltage selection circuit of a semiconductor memory device that uses a plurality of power supply voltages is provided. The voltage selection circuit may include a voltage level regulating circuit configured to convert voltage levels of test mode signals to generate gate control signals; and metal-oxide semiconductor (MOS) transistors connected to the power supply voltages, respectively, and configured to be selectively turned on in response to the gate control signals to output the selected power supply voltage.

An example embodiment of the present invention provides a method for selecting one of a plurality of power supply voltages of a semiconductor device for testing. The method may include generating gate control signals based on test mode signals and selecting a power supply voltage of the plurality of power supply voltages to be tested based on the generated gate control signals. The method may also include outputting the selected power supply voltage to a pad used to test each of the plurality of power supply voltages.

A semiconductor memory device and a voltage selection circuit according to the example embodiments of the present invention may reduce the number of pads used and/or required for testing the power supply voltages used in the semiconductor device by generating the gate control signals of which the voltage levels are level-shifted.

BRIEF DESCRIPTION OF THE DRAWINGS

The above and other features and advantages of the present invention will become readily apparent to one skilled in the art by considering the following detailed description of example embodiments of the present invention in conjunction with the accompanying drawings in which.

DESCRIPTION OF EXAMPLE EMBODIMENTS OF THE PRESENT INVENTION

Example embodiments of the present invention are described more fully hereinafter with reference to the accompanying drawings. Example embodiments may, however, be embodied in many different forms and should not be construed as limited to the example embodiments set forth herein. Rather, these example embodiments are provided so that this disclosure will be thorough and complete, and will fully convey the scope of the invention to those skilled in the art. Like numbers refer to like components throughout.

It will be understood that although the terms first and second are used herein to describe components, these components should not be construed as limited by these terms. These terms are merely used to distinguish one component from another component. Thus, a first component discussed below could be termed a second component, and similarly, a second component may be termed a first component without departing from the teachings of the present invention.

The terminology used herein is for the purpose of describing particular example embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with the meaning of the terms in the context of the relevant art and will not be interpreted in an idealized or overly formal sense unless expressly so defined herein.

Figure 1:
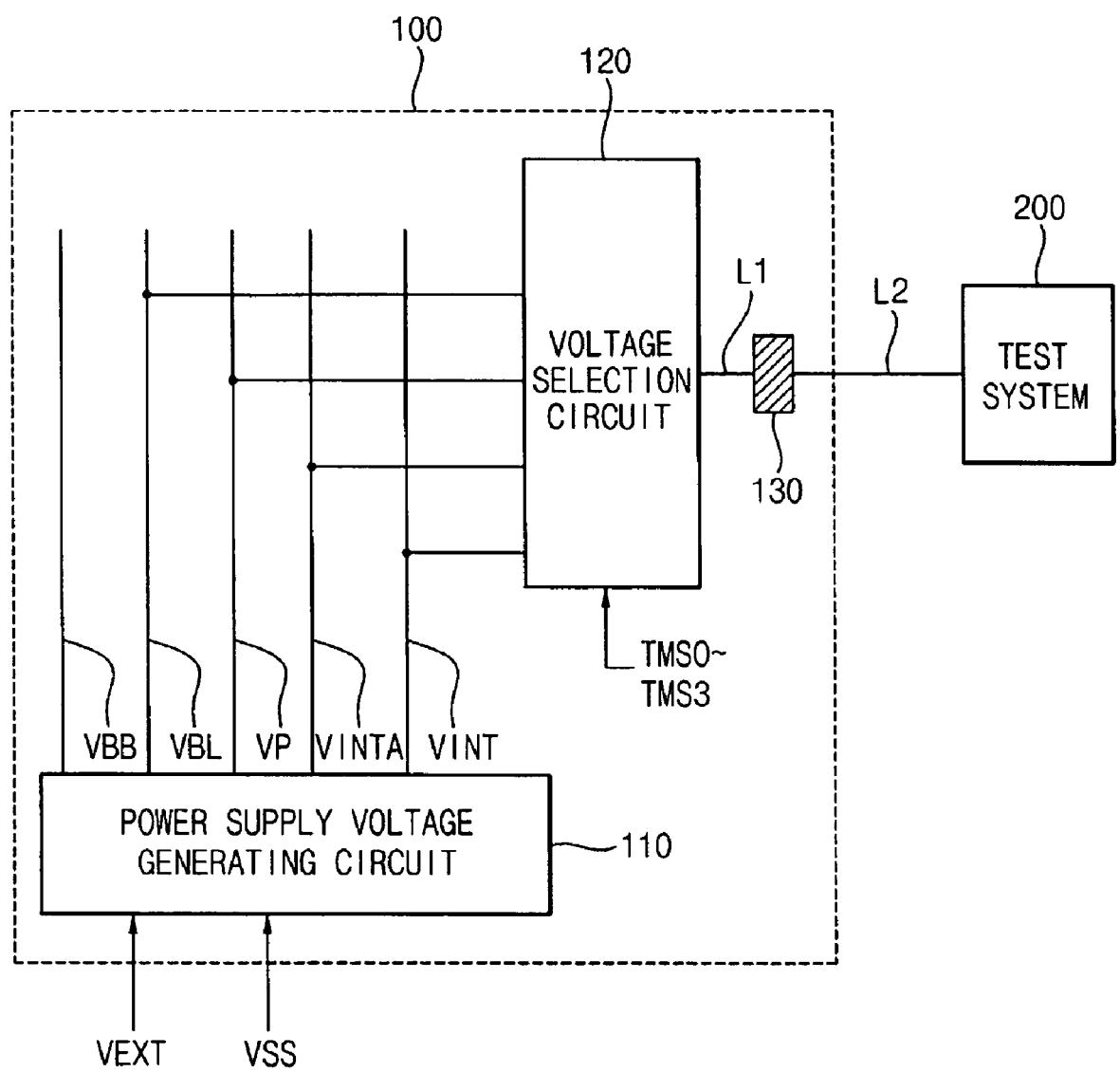
FIG. 1 is a block diagram illustrating a semiconductor memory device according to an example embodiment of the present invention.

FIG. 1 is a block diagram illustrating a semiconductor memory device 100 according to an example embodiment of the present invention.

Referring to FIG. 1, the semiconductor memory device 100 may include a power supply voltage generating circuit 110, a voltage selection circuit 120 and a pad 130. As illustrated in FIG. 1, the semiconductor memory device 100 may be coupled to a test system 200 for testing power supply voltages of the semiconductor memory device 100.

The power supply voltage generating circuit 110 may receive an external power supply voltage VEXT and a ground voltage VSS and may generate various power supply voltages. For example, the power supply voltage generating circuit 110 may generate an internal power supply voltage VINT for a peripheral circuit, an internal power supply voltage VINTA for a memory array, a plate voltage VP, a precharge voltage VBL and a back bias voltage VBB used for a bias of a semiconductor substrate.

The voltage selection circuit 120 may select the power supply voltages VINT, VINTA, VP and VBL, for example, and may provide the selected voltage through a line L1 to the pad 130. An output of the pad 130 may be provided through a line L2 to the test system 200.

Figure 2:
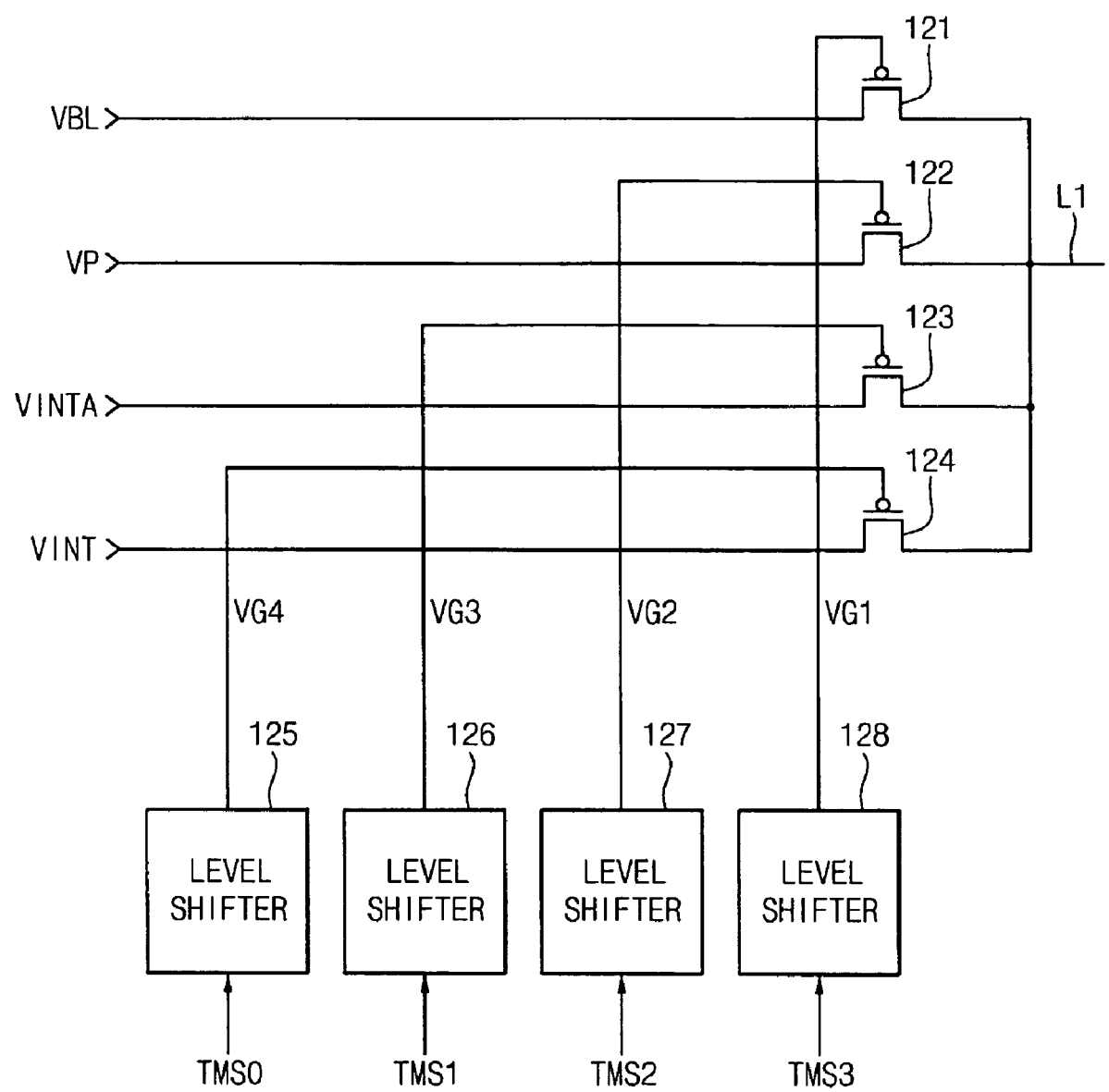
FIG. 2 is a block diagram illustrating a selection circuit according to an example embodiment of the present invention, which may be included in the semiconductor memory device shown in FIG. 1.

FIG. 2 is a block diagram illustrating a voltage selection circuit 120 according to an example embodiment of the present invention, which may be included in the semiconductor memory device 100 shown in FIG. 1.

The voltage selection circuit 120 may include metal-oxide semiconductor (MOS) transistors and level-shifters. For example, the voltage selection circuit may include P-type metal-oxide semiconductor (PMOS) transistors 121 through 124 and level-shifters 125 through 128 as shown in FIG. 2.

The PMOS transistors 121 through 124 may select the power supply voltages VINT, VINTA, VP and VBL, for example, and may provide the selected voltage through the line L1 to the pad 130.

The level-shifters 125 through 128 may receive test mode signals TMS0 through TMS3 to generate gate control signals VG1 through VG4, respectively. The level-shifters 125 through 128 may control voltage levels of the test mode signals TMS0 through TMS3 based on the respective voltage levels of the test mode signals TMS0 through TMS3. The gate control signals VG1 through VG4 may be provided to gates of the PMOS transistors 121 through 124.

Figure 3:
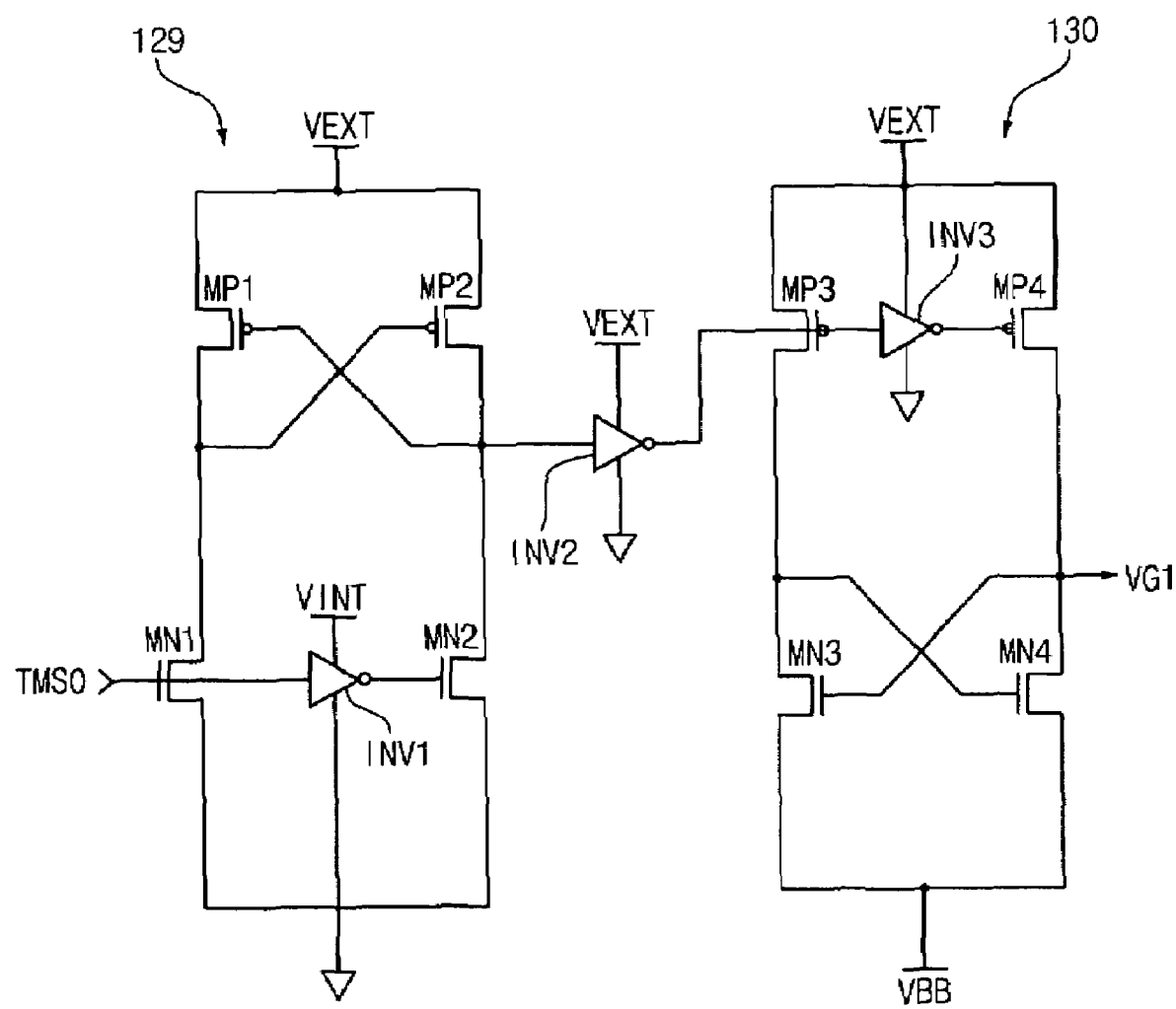
FIG. 3 is a circuit diagram illustrating an example configuration of a level-shifter, which may be included in the selection circuit shown in FIG. 2.

FIG. 3 is a circuit diagram illustrating an example configuration of the level-shifter 125, which may be included in the voltage selection circuit 120 shown in FIG. 2. The level-shifters 126, 127 and 128 shown in FIG. 2 may have substantially the same configuration as the level-shifter 125 described with respect to FIG. 3.

Referring to FIG. 3, the level-shifter 125 may include a first level-shifting circuit 129, an inverter INV2 and a second level-shifting circuit 130.

The first level-shifting circuit 129 may convert the test mode signal TMS0 having a first voltage level of logic "high" into an output signal having a second voltage level of logic "high". The second voltage level may be higher than the first voltage level. The inverter INV2 may invert the output signal of the first level-shifting circuit 129. The second level-shifting circuit 130 may convert an output signal of the inverter INV2 having a third voltage level of logic "low" into the corresponding gate control signal VG1 having a fourth voltage level of logic "low". The fourth voltage level may be lower than the third voltage level.

The first level-shifting circuit 129 may include P-type MOS (PMOS) transistors MP1 and MP2, N-type MOS (NMOS) transistors MN1 and MN2, and an inverter INV1.

The NMOS transistor MN1 may have a gate to which the test mode signal TMS0 applied and a source coupled to a ground voltage. The inverter INV1 may receive and invert the test mode signals TMS0. The NMOS transistor MN2 may have a gate to which an output signal of the inverter INV1 is applied and a source coupled to the ground voltage. The PMOS transistor MP1 may have a source coupled to the external power supply voltage VEXT, a drain coupled to a drain of the NMOS transistor MN1, and a gate coupled to a drain of the NMOS transistor MN2. The PMOS transistor MP2 may have a source coupled to the external power supply voltage VEXT, a drain coupled to the drain of the NMOS transistor MN2, and a gate coupled to the drain of the NMOS transistor MN1.

The second level-shifting circuit 130 may include PMOS transistors MP3 and MP4, NMOS transistors MN3 and MN4, and an inverter INV3.

The PMOS transistor MP3 may have a gate to which an output signal of the inverter INV2 is applied and a source coupled to the external power supply voltage VEXT. The inverter INV3 may invert the output signal of the inverter INV2. The PMOS transistor MP4 may have a gate to which an output signal of the inverter INV3 is applied and a source coupled to the external power supply voltage VEXT.

The NMOS transistor MN3 may have a source coupled to the back bias voltage VBB, a drain coupled to the drain of the PMOS transistor MP3 and a gate coupled to the drain of the PMOS transistor MP4. The NMOS transistor MN4 may have a source coupled to the back bias voltage VBB, a drain coupled to the drain of the PMOS transistor MP4, and a gate coupled to the drain of the NMOS transistor MN3. The gate control signals VG1 through VG4 may be output from the drain electrode of the NMOS transistor MN4.

Hereinafter, an example operation of the level-shifter 125 shown in FIG. 3 will be discussed in detail. The operation and the configuration of the level-shifters 126, 127 and 128 may be substantially the same as those of the level-shifter 125 and thus, the description of the operation and structure of the level-shifters 126, 127 and 128 will be omitted herein for the sake of brevity.

The test mode signal TMS0 may be a signal having a voltage level corresponding to the internal power supply voltage VINT. The power supply voltage supplied to the inverter INV1 may be the internal power supply voltage VINT The voltage supplied to the source of the PMOS transistors MP1 and MP2 may be the external power supply voltage VEXT. The voltage supplied to the source of the NMOS transistors MN1 and MN2 may be the ground voltage, and the voltage supplied to the inverter INV2 may be the external power supply voltage VEXT. In addition, the voltage supplied to the source of the PMOS transistors MP3 and MP4 may be the external power supply voltage VEXT, and the voltage supplied to the source of the NMOS transistors MN3 and MN4 may be the back bias voltage VBB. The voltage supplied to the inverter INV3 may be the external power supply voltage VEXT. In general, the external power supply voltage VEXT may have a voltage level higher than the internal power supply voltage VINT, which may be provided for the peripheral circuit. The back bias voltage VBB may have a voltage level lower than the ground voltage VSS. For example, the back bias voltage VBB may have a voltage level of about −0.7 V when the ground voltage VSS has a voltage level of about 0 V.

According to the example operation, if the test mode signals TMS0 is logic "high," the drain voltage of the NMOS transistor MN2 is logic "high." Therefore, the output of the inverter INV2 is logic "low," and the gate control signals VG1, which is the drain voltage of the NMOS transistor MN4, is logic "low."

According to the example operation, if the test mode signals TMS0 is logic "low," the drain voltage of the NMOS transistor MN2 is logic "low." Therefore, the output of the inverter INV2 is logic "high," and the gate control signal VG1, which is the drain voltage of the NMOS transistor MN4, is logic "high."

In the example operation, the first level-shifting circuit 129 functions to cause the test mode signal TMS0 to be level-shifted from the VINT voltage level to the VEXT voltage level, thereby raising the high voltage level of the test mode signal TMS0.

Also in the example operation, the second level-shifting circuit 130 functions to cause the test mode signal TMS0 to be level-shifted from the ground voltage VSS voltage level to the VBB voltage level, thereby lowering the low voltage level of the test mode signal TMS0. The back bias voltage VBB has a voltage level lower than 0 V, for example, −0.7 V.

According to an example embodiment of the present invention, the voltage levels of the test mode signals TMS1, TMS2 and TMS3 may be level-shifted using the same process as described above with respect to the test mode signal TMS0. If one of the gate control signals VG1 through VG4 is logic "low," a corresponding transistor of the PMOS transistors 121 through 124 shown in FIG. 2 is turned on, so that the power supply voltages of the semiconductor device may be output to the pad to be tested. If one of the test mode signals, that is, the output signal of the level-shifter of FIG. 3 is logic "low," the voltage level of the output signal is the back bias voltage VBB, which is lower than the ground voltage VSS. The PMOS transistors 121 through 124 of FIG. 2 may be turned on in response to the lowered voltage levels of the gate control signals VG1 through VG4, even if the power supply voltages VINT, VINTA, VP and VBL are somewhat decreased. Therefore, the level-shifter of FIG. 3 may allow the power supply voltages VINT, VINTA, VP and VBL to be easily tested through the pad 130.

Figure 4:
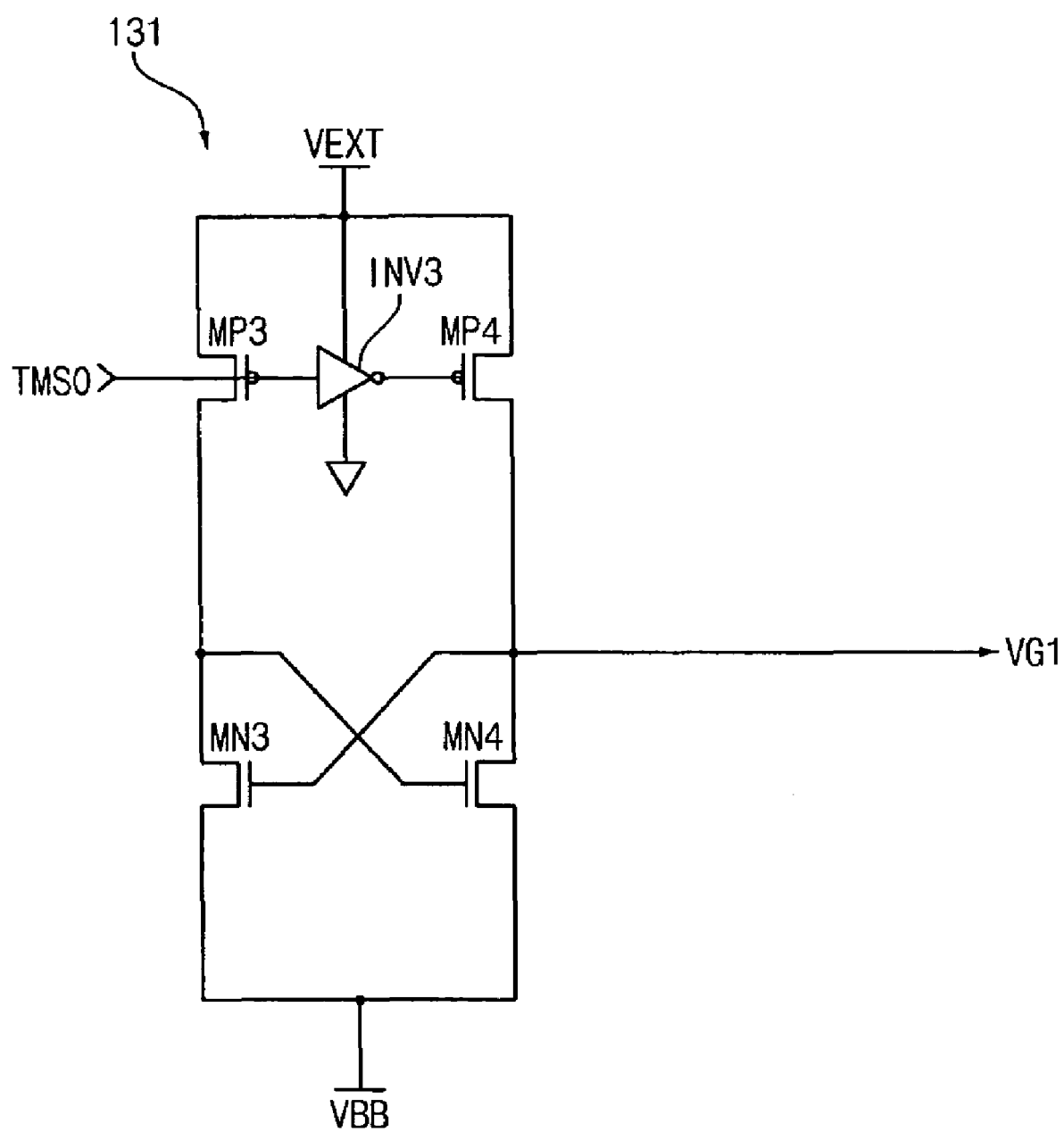
FIG. 4 is a circuit diagram illustrating another example configuration of a level-shifter, which may be included in the selection circuit shown in FIG. 2.

FIG. 4 is a circuit diagram illustrating another example configuration of a level-shifter 125, which may be used in the voltage selection circuit 120 shown in FIG. 2. The level-shifters 126, 127 and 128 of FIG. 2 may have substantially the same configuration as that of the level-shifter shown in FIG. 4.

Referring to FIG. 4, the level-shifter 125 may be implemented with a level-shifting circuit 131 that includes PMOS transistors MP3 and MP4, an inverter INV3, and NMOS transistors MN3 and MN4.

The PMOS transistor MP3 may have a gate that receives the test mode signal TMS0 and a source coupled to the external power supply voltage VEXT. The inverter INV3 may invert the test mode signal TMS0. The PMOS transistor MP4 may have a gate that receives an output signal from the inverter INV3 and a source coupled to the external power supply voltage VEXT. The NMOS transistor MN3 may have a source coupled to the back bias voltage VBB, a drain coupled to a drain of the PMOS transistor MP3, and a gate coupled to a drain of the PMOS transistor MP4. The NMOS transistor MN4 may have a source coupled to the back bias voltage VBB, a drain coupled to the drain of the PMOS transistor MP4, and a gate coupled to the drain of the NMOS transistor MN3.

The level-shifting circuit 131 may function to cause the test mode signals TMS0 to be level-shifted from the VSS voltage level to the VBB voltage level, thereby lowering the low voltage level of the test mode signal TMS0. The back bias voltage VBB may have a voltage level of, for example, −0.7 V, lower than 0 V of the ground voltage VSS.

The level-shifter shown in FIG. 4 may be adapted if the external power supply voltage VEXT is used as the internal power supply voltage of the semiconductor memory device. The level-shifting circuit 131 of FIG. 4 has the same configuration as that of the second level-shifting circuit 130 of FIG. 3.

As discussed above, a semiconductor memory device and a voltage selection circuit according to the example embodiments of the present invention may reduce the number of pads required for testing the power supply voltages that are used in a semiconductor device by generating the gate control signals of which the voltage levels are level-shifted.

Example embodiments of the present invention are described above with respect to the drawings and specification. Although specific terms are used to describe the example embodiments of the present invention, the terms are used in a generic and descriptive sense only and not for purposes of limiting the scope of the invention as set forth in the following claims.

What is claimed is:

1. A semiconductor memory device comprising:
    a pad;
    a power supply voltage generating circuit configured to generate a plurality of power supply voltages; and
    a voltage selection circuit configured to select one of the power supply voltages in response to test mode signals and to provide the selected power supply voltage to the pad, the voltage selection circuit including:
        a voltage level regulating circuit configured to convert voltage levels of the test mode signals to generate gate control signals; and
        a plurality of metal-oxide semiconductor (MOS) transistors, each connected to one of the power supply voltages and configured to be turned on in response to a corresponding gate control signal of the gate control signals and to provide the selected power supply voltage to the pad, wherein the voltage level regulating circuit includes a plurality of level-shifters, each connected to a gate electrode of one of the plurality of MOS transistors, and configured to generate the corresponding gate control signal in response to a corresponding test mode signal.

2. The semiconductor memory device of claim 1, wherein each of the level-shifters includes:
    a first level-shifting circuit configured to convert the corresponding test mode signal having a first voltage level of logic high into a first output signal having a second voltage level of logic high;
    an inverting circuit configured to invert the first output signal; and
    a second level-shifting circuit configured to convert an output signal of the inverting circuit having a third voltage level of logic low into a corresponding gate control signal having a fourth voltage level of logic low.

3. The semiconductor memory device of claim 2, wherein the second voltage level is higher than the first voltage level and the fourth voltage level is lower than the third voltage level.

4. The semiconductor memory device of claim 3, wherein the first voltage level is generated based on an internal power supply voltage for a peripheral circuit of the semiconductor memory device, and the second voltage level is generated based on an external power supply voltage of the semiconductor memory device.

5. The semiconductor memory device of claim 3, wherein the third voltage level is generated based on a ground voltage of the semiconductor memory device, and the fourth voltage level is generated based on a back bias voltage of the semiconductor memory device.

6. The semiconductor memory device of claim 1, wherein each of the level-shifters includes a level-shifting circuit configured to convert the corresponding test mode signal having a first low voltage level into the corresponding gate control signal having a second low voltage level.

7. The semiconductor memory device of claim 6, wherein the second low voltage level is lower than the first low voltage level.

8. The semiconductor memory device of claim 7, wherein the first low voltage level is generated based on a ground voltage of the semiconductor memory device, and the second low voltage level is generated based on a back bias voltage of the semiconductor memory device.

9. The semiconductor memory device of claim 1, wherein the plurality of power supply voltages include an internal power supply voltage for a peripheral circuit, an internal power supply voltage for a memory array, a plate voltage, a precharge voltage, and a back bias voltage.

10. A voltage selection circuit comprising:
    a voltage level regulating circuit configured to convert voltage levels of test mode signals to generate gate control signals; and
    a plurality of metal-oxide semiconductor (MOS) transistors, each connected to one of a plurality of power supply voltages and configured to be turned on in response to a corresponding gate control signal of the gate control signals and to output a selected power supply voltage, wherein the voltage level regulating circuit includes a plurality of level-shifters, each connected to a gate electrode of one of the plurality of MOS transistors, and configured to generate the gate control signal in response to a corresponding test mode signal.

11. The voltage selection circuit of claim 10, wherein each of the level-shifters includes:
    a first level-shifting circuit configured to convert the corresponding test mode signal having a first voltage level of logic high into a first output signal having a second voltage level of logic high;
    an inverting circuit configured to invert the first output signal; and
    a second level-shifting circuit configured to convert an output signal of the inverting circuit having a third voltage level of logic low into the corresponding gate control signal having a fourth voltage level of logic low.

12. The voltage selection circuit of claim 11, wherein the second voltage level is higher than the first voltage level and the fourth voltage level is lower than the third voltage level.

13. The voltage selection circuit of claim 10, wherein each of the level-shifters includes a level-shifting circuit configured to convert the corresponding test mode signal having a first low voltage level into the corresponding gate control signal having a second low voltage level.

14. The voltage selection circuit of claim 13, wherein the second low voltage level is lower than the first low voltage level.

15. A method for selecting one of a plurality of power supply voltages of a semiconductor device for testing, the method comprising:

generating gate control signals based on test mode signals; and selecting a power supply voltage of the plurality of power supply voltages to be tested based on the generated gate control signals, wherein generating the gate control signals includes shifting a voltage level of the test mode signals using at least one of the plurality of power supply voltages to generate the gate control signals.

16. The method of claim 15 further comprising:

outputting the selected power supply voltage to a pad used to test each of the plurality of power supply voltages.

* * * * *